(12) United States Patent
Cao et al.

(10) Patent No.: US 12,193,309 B2
(45) Date of Patent: Jan. 7, 2025

(54) ORGANIC LIGHT-EMITTING DIODE DISPLAY PANEL AND ELECTRONIC DEVICE HAVING ORGANIC PACKAGING LAYER

(71) Applicant: SHENZHEN CHINA STAR OPTOELECTRONICS SEMICONDUCTOR DISPLAY TECHNOLOGY CO., LTD., Guangdong (CN)

(72) Inventors: Weiran Cao, Guangdong (CN); Jinchuan Li, Guangdong (CN); Ying Liu, Guangdong (CN); Wendong Lian, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/623,188

(22) PCT Filed: Dec. 21, 2021

(86) PCT No.: PCT/CN2021/140174
§ 371 (c)(1),
(2) Date: Dec. 27, 2021

(87) PCT Pub. No.: WO2023/108730
PCT Pub. Date: Jun. 22, 2023

(65) Prior Publication Data
US 2024/0049568 A1    Feb. 8, 2024

(30) Foreign Application Priority Data
Dec. 17, 2021   (CN) .......................... 202111555051.7

(51) Int. Cl.
*H10K 59/80*   (2023.01)
*H10K 59/12*   (2023.01)

(52) U.S. Cl.
CPC ........... *H10K 59/873* (2023.02); *H10K 59/12* (2023.02)

(58) Field of Classification Search
CPC ............................. H10K 59/873; H10K 59/12
(Continued)

(56) References Cited

U.S. PATENT DOCUMENTS

| 2014/0132148 A1* | 5/2014 | Jang .................. H10K 50/8445 313/504 |
| 2016/0041413 A1 | 2/2016 | Nishino et al. |

(Continued)

FOREIGN PATENT DOCUMENTS

| CN | 107425136 A | 12/2017 |
| CN | 110034237 A | 7/2019 |

(Continued)

OTHER PUBLICATIONS

International Search Report in International application No. PCT/CN2021/140174, mailed on Sep. 14, 2022.

(Continued)

*Primary Examiner* — Lex H Malsawma
*Assistant Examiner* — Eric W Jones
(74) *Attorney, Agent, or Firm* — PV IP PC; Wei Te Chung

(57) ABSTRACT

An OLED display panel and an electronic device are disclosed. The OLED display panel comprises a main display part and a first organic packaging layer, and the main display part has a display area and a non-display area disposed around the display area; and the first organic packaging layer is disposed on the main display part, wherein the first organic packaging layer comprises a first organic packaging (Continued)

section, the first organic packaging section is located in the non-display area, and the first organic packaging section comprises water absorbent.

20 Claims, 4 Drawing Sheets

(58) Field of Classification Search
USPC .................................................. 257/40, 59
See application file for complete search history.

(56) References Cited

U.S. PATENT DOCUMENTS

| | | |
|---|---|---|
| 2017/0194597 A1 | 7/2017 | Pang |
| 2019/0157618 A1* | 5/2019 | Park ................... H10K 59/8731 |
| 2021/0280824 A1 | 9/2021 | Ma et al. |

FOREIGN PATENT DOCUMENTS

| | | |
|---|---|---|
| CN | 110112309 A | 8/2019 |
| CN | 110518043 A | 11/2019 |
| CN | 110663120 A | 1/2020 |
| CN | 111834541 A | 10/2020 |
| CN | 112563432 A | 3/2021 |
| IN | 111900260 A | 11/2020 |

OTHER PUBLICATIONS

Written Opinion of the International Search Authority in International application No. PCT/CN2021/140174, mailed on Sep. 14, 2022.

Chinese Office Action issued in corresponding Chinese Patent Application No. 202111555051.7 dated Apr. 29, 2023, pp. 1-10.

* cited by examiner

ORGANIC LIGHT-EMITTING DIODE DISPLAY PANEL AND ELECTRONIC DEVICE HAVING ORGANIC PACKAGING LAYER

BACKGROUND OF INVENTION

Field of Invention

The present application relates to a field of display technology, and particularly to an OLED display panel and an electronic device.

Description of Prior Art

Organic light-emitting diode (OLED) display devices are current driven organic light-emitting devices. The OLED display devices are widely used in a flexible display industry because of their characteristics of bending, high brightness, and low power consumption. Compared with liquid crystal materials in traditional liquid crystal displays, organic light-emitting materials used in the OLED display devices are easy to age. Therefore, in order to prolong life of the OLED display devices, it is usually necessary to design high water resistance packaging structures to reduce a risk of a water vapor intrusion in the OLED display devices.

At present, a mainstream flexible packaging method is a thin film encapsulation (TFE), which is a laminated structure comprising inorganic films and organic films. Wherein, materials of the inorganic films usually comprise silicon nitride, silicon oxide, or silicon oxynitride, and the inorganic films are usually prepared by a plasma enhanced chemical vapor deposition (PECVD) and have an excellent water and oxygen barrier effect; and materials of the organic films usually comprise high polymers, on the one hand, the high polymers have a characteristic of good plasticity, which is conducive to stress releases of the inorganic films; in addition, the organic films with certain thicknesses can not only effectively cover foreign matters generated in productive processes and prevent the inorganic films from being pierced, but also effectively prolong a water vapor intrusion channel to delay a failure time of the OLED display devices.

SUMMARY OF INVENTION

However, although the TFE structure can effectively block most of the water vapor, once a membrane quality of the inorganic films prepared by the PECVD changes or the inorganic films are damaged, the organic light-emitting diode (OLED) display devices will soon fail. In the prior art, in order to prevent the water vapor from directly invading display areas from an edge section of the organic films, the organic films are generally retracted, that is, there are only the inorganic films at edges of display panels. At this time, once water resistance of the inorganic films at the edges of the display panels decreases or the inorganic films crack, the water vapor will directly enter the display areas along the edges of the display panels, and then corrode cathodes, destroy structures of the OLED display devices, and cause the OLED display devices failure, which will reduce life of the OLED display devices. Therefore, improving a packaging effect of the edges of the OLED display devices is a key to improve life of the OLED display devices.

The present application provides an OLED display panel and an electronic device to improve the packaging effect of the edges of the OLED display devices in the prior art.

An embodiment of the present application provides an OLED display panel, which comprises:
- a main display part having a display area and a non-display area disposed around the display area; and
- a first organic packaging layer disposed on the main display part, wherein the first organic packaging layer comprises a first organic packaging section, the first organic packaging section is located in the non-display area, and the first organic packaging section comprises water absorbent.

Alternatively, in some embodiments of the present application, wherein the main display part comprises a driving substrate, a light-emitting layer and a first electrode arranged in sequence, the light-emitting layer is located in the display area, the first electrode covers the light-emitting layer and extends from the display area to the non-display area, and the first organic packaging section is arranged on the driving substrate and located on one side of the first electrode away from the display area.

Alternatively, in some embodiments of the present application, wherein the OLED display panel further comprises a first retaining wall arranged on the driving substrate, and the first retaining wall is located on one side of the first organic packaging section away from the display area.

Alternatively, in some embodiments of the present application, wherein the OLED display panel further comprises a first inorganic packaging layer and a second inorganic packaging layer, the first inorganic packaging layer is arranged between the first electrode and the first organic packaging layer, the second inorganic packaging layer is arranged on one side of the first organic packaging layer away from the first inorganic packaging layer, and the first inorganic packaging layer and the second inorganic packaging layer extend from the display area to the non-display area and cover the first retaining wall.

Alternatively, in some embodiments of the present application, wherein the OLED display panel further comprises a second retaining wall, the second retaining wall is arranged on the driving substrate, and a height of the second retaining wall is less than a height of the first retaining wall; and the second retaining wall is located between the first organic packaging section and the first retaining wall.

Alternatively, in some embodiments of the present application, wherein the OLED display panel further comprises a second retaining wall, the second retaining wall is arranged on the driving substrate, and a height of the second retaining wall is less than a height of the first retaining wall; and the first organic packaging section covers the second retaining wall and extends to an area where the driving substrate is located between the first retaining wall and the second retaining wall.

Alternatively, in some embodiments of the present application, wherein the first organic packaging layer further comprises a second organic packaging section, the second organic packaging section covers the first electrode and is connected with a surface of the first organic packaging section close to the display area; and an end of the first organic packaging section is flush with an end of the second organic packaging section.

Alternatively, in some embodiments of the present application, wherein the first organic packaging layer further comprises a second organic packaging section, and the second organic packaging section covers the first electrode and is connected with a surface of the first organic packaging section close to the display area; and packaging materials in the first organic packaging section are the same as packaging materials in the second organic packaging section.

Alternatively, in some embodiments of the present application, wherein, from the display area to a direction towards the non-display area, a mass content of the water absorbent in the first organic packaging section gradually increases.

Alternatively, in some embodiments of the present application, wherein the OLED display panel further comprises a first inorganic packaging layer, a second organic packaging layer and a second inorganic packaging layer arranged in sequence on the first electrode, the first inorganic packaging layer, the second organic packaging layer and the second inorganic packaging layer extend from the display area to the non-display area, the first inorganic packaging layer and the second inorganic packaging layer cover the first retaining wall, the first organic packaging layer is located on one side of the second inorganic packaging layer away from the first inorganic packaging layer, and the first organic packaging section is located between the second organic packaging layer and the first retaining wall.

Alternatively, in some embodiments of the present application, wherein the second organic packaging layer comprises a third organic packaging section, the third organic packaging section is located in the non-display area, and the third organic packaging section comprises water absorbent.

An embodiment of the present application also provides an OLED display panel, which comprises:
  a main display part having a display area and a non-display area disposed around the display area; and
  a first organic packaging layer disposed on the main display part, wherein the first organic packaging layer comprises a first organic packaging section, the first organic packaging section is located in the non-display area, wherein the first organic packaging section comprises water absorbent, and from the display area to a direction towards the non-display area, a mass content of the water absorbent in the first organic packaging section gradually increases;
  wherein the main display part comprises a driving substrate, a light-emitting layer and a first electrode arranged in sequence, the light-emitting layer is located in the display area, the first electrode covers the light-emitting layer and extends from the display area to the non-display area, and the first organic packaging section is arranged on the driving substrate and located on one side of the first electrode away from the display area.

An embodiment of the present application also provides an electronic device, wherein the electronic device comprises a housing and an OLED display panel arranged in the housing, and the OLED display panel comprises:
  a main display part having a display area and a non-display area disposed around the display area; and
  a first organic packaging layer disposed on the main display part, wherein the first organic packaging layer comprises a first organic packaging section, the first organic packaging section is located in the non-display area, and the first organic packaging section comprises water absorbent.

Alternatively, in some embodiments of the present application, wherein the main display part comprises a driving substrate, a light-emitting layer and a first electrode arranged in sequence, the light-emitting layer is located in the display area, the first electrode covers the light-emitting layer and extends from the display area to the non-display area, and the first organic packaging section is arranged on the driving substrate and located on one side of the first electrode away from the display area.

Alternatively, in some embodiments of the present application, wherein the OLED display panel further comprises a first retaining wall arranged on the driving substrate, and the first retaining wall is located on one side of the first organic packaging section away from the display area.

Alternatively, in some embodiments of the present application, wherein the OLED display panel further comprises a first inorganic packaging layer and a second inorganic packaging layer, the first inorganic packaging layer is arranged between the first electrode and the first organic packaging layer, the second inorganic packaging layer is arranged on one side of the first organic packaging layer away from the first inorganic packaging layer, and the first inorganic packaging layer and the second inorganic packaging layer extend from the display area to the non-display area and cover the first retaining wall.

Alternatively, in some embodiments of the present application, wherein the OLED display panel further comprises a second retaining wall, the second retaining wall is arranged on the driving substrate, and a height of the second retaining wall is less than a height of the first retaining wall; and the second retaining wall is located between the first organic packaging section and the first retaining wall.

Alternatively, in some embodiments of the present application, wherein the OLED display panel further comprises a second retaining wall, the second retaining wall is arranged on the driving substrate, and a height of the second retaining wall is less than a height of the first retaining wall; and the first organic packaging section covers the second retaining wall and extends to an area where the driving substrate is located between the first retaining wall and the second retaining wall.

Alternatively, in some embodiments of the present application, wherein the first organic packaging layer further comprises a second organic packaging section, the second organic packaging section covers the first electrode and is connected with a surface of the first organic packaging section close to the display area; and an end of the first organic packaging section is flush with an end of the second organic packaging section.

Alternatively, in some embodiments of the present application, wherein the first organic packaging layer further comprises a second organic packaging section, and the second organic packaging section covers the first electrode and is connected with a surface of the first organic packaging section close to the display area; and packaging materials in the first organic packaging section are the same as packaging materials in the second organic packaging section.

Compared with the OLED display panels in the prior art, in the present application, by setting the first organic packaging section in the non-display area of the OLED display panel, since the first organic packaging section contains water absorbent, when the external water vapor invade the non-display area in the main display part, the water absorbent in the first organic packaging section can effectively absorb part of the water vapor, which can delay a time of a water vapor intrusion, reduce a probability of the water vapor intrusion to the display area, and help to improve life of the OLED display panel.

BRIEF DESCRIPTION OF DRAWINGS

In order to explain embodiments or technical solutions in prior arts clearly, the following will briefly introduce drawings needed to be used in description of the embodiments or the prior arts. The drawings in the following description are only some embodiments of the invention. For those skilled in the art, other drawings can also be obtained from these drawings without paying creative labor.

DETAILED DESCRIPTION OF EMBODIMENTS

Figure 1:
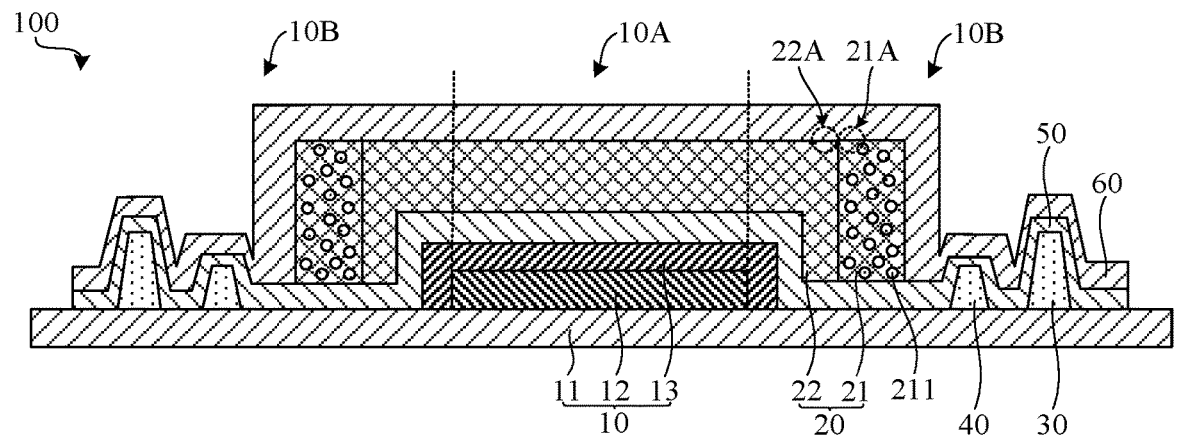
FIG. 1 is a schematic structural diagram of an OLED display panel provided in a first embodiment of the present application.

The technical scheme in the embodiment of the application will be described clearly and completely below in combination with the accompanying drawings in the embodiment of the application. Obviously, the described embodiments are only part of the embodiments of the application, not all of the embodiments. Based on the embodiments in the application, all other embodiments obtained by those skilled in the art without creative work belong to the scope of protection of the application. In addition, it should be understood that the specific embodiments described herein are only used to illustrate and explain the application and are not used to limit the application. In the present application, in the absence of a contrary explanation, the location words used, such as "up" and "down", usually refer to the up and down under the actual use or working state of the device, specifically the drawing direction in the attached drawings; The "inside" and "outside" are for the contour of the device.

Embodiments of the present application provides an organic light-emitting diode (OLED) display panel and an electronic device. These are described in detail below. It should be noted that an order of descriptions of the following embodiments is not a limitation on a preferred order of the embodiments.

The present application provides the OLED display panel, which comprises a main display part and a first organic packaging layer. The main display part has a display area and a non-display area disposed around the display area. The first organic packaging layer is disposed on the main display part, wherein the first organic packaging layer comprises a first organic packaging section, the first organic packaging section is located in the non-display area, and the first organic packaging section comprises water absorbent.

Therefore, in the present application, by setting the first organic packaging section in the non-display area of the OLED display panel, since the first organic packaging section contains water absorbent, when external water vapor invade the non-display area in the main display part, the water absorbent in the first organic packaging section can effectively absorb part of the water vapor, which can delay a time of a water vapor intrusion, reduce a probability of a water vapor intrusion to the display area, and help to improve life of the OLED display panel.

The OLED display panel provided by the present application will be described in detail through specific embodiments.

Referring to FIG. 1, a first embodiment of the present application provides the OLED display panel 100. The OLED display panel 100 comprises the main display part 10 and the first organic packaging layer 20. The main display part 10 has the display area 10A and the non-display area 10B disposed around the display area 10A. The first organic packaging layer 20 is disposed on the main display part 10. The first organic packaging layer 20 comprises the first organic packaging section 21. The first organic packaging section 21 is located in the non-display area 10B. The first organic packaging section 21 comprises the water absorbent 211.

Specifically, the main display part 10 comprises a driving substrate 11, a light-emitting layer 12, and a first electrode 13 arranged in sequence.

Wherein, the driving substrate 11 can be a thin film transistor substrate. The thin film transistor substrate comprises a substrate and a thin film transistor device (not shown in drawings) disposed on the substrate, and it can be understood that related technologies are the prior art and will not be repeated here.

The light-emitting layer 12 is located in the display area 10A. The first electrode 13 covers the light-emitting layer 12. The first electrode 13 extends from the display area 10A to the non-display area 10B. Wherein, the first electrode 13 can be an anode or a cathode. In the present embodiment, the first electrode 13 is the cathode, in this case, the anode (not shown in the drawings) is arranged on one side of the driving substrate 11 close to the light-emitting layer 12, and it can be understood that related technologies are the prior art and will not be repeated here.

It should be noted that only a structure of the light-emitting layer 12 is shown in the drawings of the present application for the convenience of describing various embodiments, the OLED display panel of the present application also comprises a plurality of array arranged light-emitting devices (not shown in the drawings), wherein the light-emitting devices are composed of the anode, the light-emitting layer and the cathode, and it can be understood that related technologies are the prior art and will not be repeated here.

In the present embodiment, the first organic packaging section 21 is disposed on the driving substrate 11. The first organic packaging section 21 is located on one side of the first electrode 13 away from the display area 10A. Since the first organic packaging section 21 in the present embodiment is located outside the first electrode 13, when the external water vapor invades the non-display area 10B, it will first enter the first organic packaging section 21. Since the water absorbent 211 in the first organic packaging section 21 can absorb the invaded water vapor, which can delay the time of the water vapor intrusion to the display area 10A, thus to reduce a probability that the cathode is corroded by the external water vapor, thereby reducing a failure probability of the light-emitting devices, and improving life of the OLED display panel 100.

In the present embodiment, the water absorbent 211 is uniformly dispersed into the first organic packaging section 21. Specifically, the water absorbent 211 comprises one or more of calcium sulfide, calcium chloride, silica gel, and activated alumina. Further, in the present embodiment, the first organic packaging section 21 also comprises packaging materials, which can comprise epoxy resin or acrylic resin.

In some embodiments, a mass content of the water absorbent 211 in the first organic packaging section 21 gradually increases from the display area 10A to a direction towards the non-display area 10B. In the above arrangement, the closer a position to the display area 10A, the smaller the mass content of the water absorbent 211 in the first organic packaging section 21. Therefore, while improving a packaging effect of the non-display area 10B, the above arrangement can also reduce an influence of the water absorbent 211 close to the display area 10A in the first organic packaging section 21 on a display effect of edge areas of the light-emitting layer 12.

The first organic packaging layer 20 also comprises a second organic packaging section 22. The second organic packaging section 22 is disposed on the driving substrate 11. The second organic packaging section 22 covers the first electrode 13 and is connected to a surface of the first organic packaging section 21 close to the display area 10A. Wherein, the second organic packaging section 22 comprises packaging materials, which can comprise the epoxy resin or the acrylic resin.

In the present embodiment, the second organic packaging section 22 does not contain the water absorbent 211, that is, the water absorbent 211 exists only in the non-display area 10B. Therefore, compared with a packaging structure containing water absorbent 211 in the display area 10A, on the one hand, the present embodiment does not need to consider an influence of the water absorbent 211 on a light output effect of the display area 10A. On the other hand, the present embodiment has low requirements on types of the water absorbent 211, the mass content of the water absorbent 211 in the first organic packaging section 21, and a dispersion degree of the water absorbent 211 in the first organic packaging section 21, which can effectively reduce a process preparation difficulty of the first organic packaging section 21, so as to reduce a process manufacturing cost.

Further, the packaging materials in the first organic packaging section 21 are the same as the packaging materials in the second organic packaging section 22, such as the epoxy resin. On the one hand, the above arrangement can improve a compatibility between the packaging materials in the first organic packaging section 21 and the packaging materials in the second organic packaging section 22, and then improve a compatibility between the first organic packaging section 21 and the second organic packaging section 22, so as to avoid affecting the packaging effect due to a difference of the packaging materials. On the other hand, when the first organic packaging section 21 and the second organic packaging section 22 are prepared by a ink-jet printing process, since it is necessary to first place the packaging materials and the water absorbent 211 in the first organic packaging section 21 in organic solvents to form ink, then form a film through the ink-jet printing process, and place the packaging materials in the second organic packaging section 22 in organic solvents to form ink, then form a film through the ink-jet printing process. When the packaging materials used in the first organic packaging section 21 and the packaging materials used in the second organic packaging section 22 are the same, leveling of the ink can be enhanced, so that a generation probability of mura during the film formation can be reduced.

Referring to FIG. 1, in the present embodiment, an end 21A of the first organic packaging section 21 is flush with an end 22A of the second organic packaging section 22. Wherein, the end 21A of the first organic packaging section 21 refers to an end of the first organic packaging section 21 away from the main display part 10, and the end 22A of the second organic packaging section 22 refers to an end of the second organic packaging section 22 away from the main display part 10. Above arrangement makes a film thickness at a junction of the first organic packaging section 21 and the second organic packaging section 22 consistent, so that the generation probability of the mura between the first organic packaging section 21 and the second organic packaging section 22 can be further reduced.

The OLED display panel 100 also comprises a first retaining wall 30. The first retaining wall 30 is disposed on the driving substrate 11. The first retaining wall 30 is disposed around the display area 10A. The first retaining wall 30 is located on one side of the first organic packaging section 21 away from the display area 10A. By arranging the first retaining wall 30 on outside of the first organic packaging section 21, it can block the first organic packaging section 21 in an area close to the display area 10A, thus to avoid an overflow of the first organic packaging section 21 to an outside of the first retaining wall 30 during a preparation process, which is conducive to improving the edge packaging effect.

In the present embodiment, numbers of the first retaining wall 30 is one, and the first retaining wall 30 is an annular structure. In addition, in some embodiments, the numbers of the first retaining wall 30 can be a plurality, and the plurality of the first retaining wall 30 are arranged in sequence around the first organic packaging section 21. The structure of the first retaining wall 30 is not specifically limited in the present application.

Further, the OLED display panel 100 also comprises a second retaining wall 40. The second retaining wall 40 is disposed on the driving substrate 11. A height of the second retaining wall 40 is less than a height of the first retaining wall 30. The second retaining wall 40 is located between the first organic packaging section 21 and the first retaining wall 30.

In the present embodiment, the OLED display panel 100 also comprises a first inorganic packaging layer 50 and a second inorganic packaging layer 60.

Wherein, the first inorganic packaging layer 50 is arranged between the first electrode 13 and the first organic packaging layer 20. The first inorganic packaging layer 50 extends from the display area 10A to the non-display area 10B. The first inorganic packaging layer 50 covers the first electrode 13, the first retaining wall 30, and the second retaining wall 40. Materials of the first inorganic packaging layer 50 can comprise one or more of silicon oxide, silicon nitride, and silicon oxynitride. The second inorganic packaging layer 60 is arranged on one side of the first organic packaging layer 20 away from the first inorganic packaging layer 50. The second inorganic packaging layer 60 extends from the display area 10A to the non-display area 10B. The second inorganic packaging layer 60 covers the first organic packaging layer 20, the first retaining wall 30, and the second retaining wall 40. Materials of the second inorganic packaging layer 60 can comprise one or more of silicon oxide, silicon nitride, and silicon oxynitride.

At edges of the non-display area 10B, if water resistance of the first inorganic packaging layer 50 and the second inorganic packaging layer 60 decreases or the first inorganic packaging layer 50 and the second inorganic packaging layer 60 crack, when the external water vapor invades, since the first organic packaging section 21 sandwiches between the first inorganic packaging layer 50 and the second inorganic packaging layer 60, the external water vapor will first enter the first organic packaging section 21 along edges of the first inorganic packaging layer 50 and the second inorganic packaging layer 60, and be absorbed by the water absorbent 211 in the first organic packaging section 21, so as to delay the time for the external water vapor to enter the display area 10A from the first organic packaging section 21, and improve the packaging effect of the edges of the OLED display panel 100.

Figure 2A:
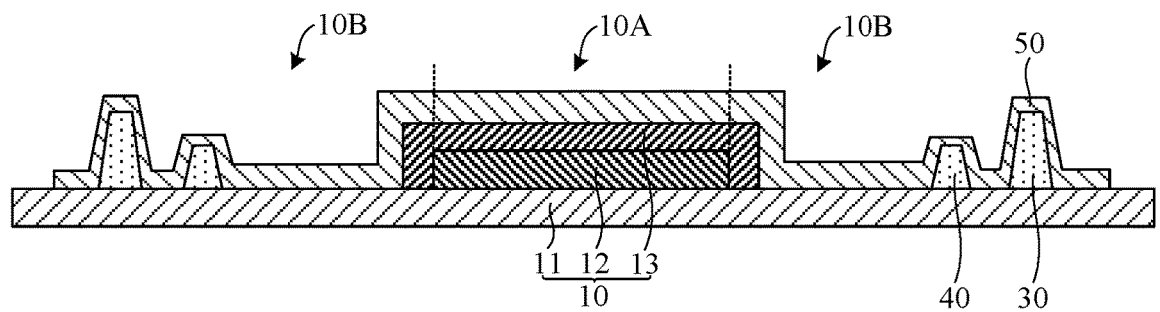
FIG. 2A to FIG. 2E are schematic structural diagrams obtained in sequence in each step of a preparation method of the OLED display panel shown in FIG. 1.

Referring to FIG. 2A to FIG. 2E, FIG. 3, and FIG. 4, a preparation method of the OLED display panel 100 provided in the first embodiment of the present application comprises following steps:

B1: providing the main display part 10, and forming the first retaining wall 30, the second retaining wall 40, and the first inorganic packaging layer 50 on the main display part 10, as shown in FIG. 2A.

Wherein, the main display part 10 has the display area 10A and the non-display area 10B disposed around the display area 10A. The main display part 10 comprises the driving substrate 11, the light-emitting layer 12, and the first electrode 13 formed in sequence.

Specifically, the first inorganic packaging layer 50 is formed by a PECVD process with materials of one or more of silicon oxide, silicon nitride, and silicon oxynitride.

Figure 2B:
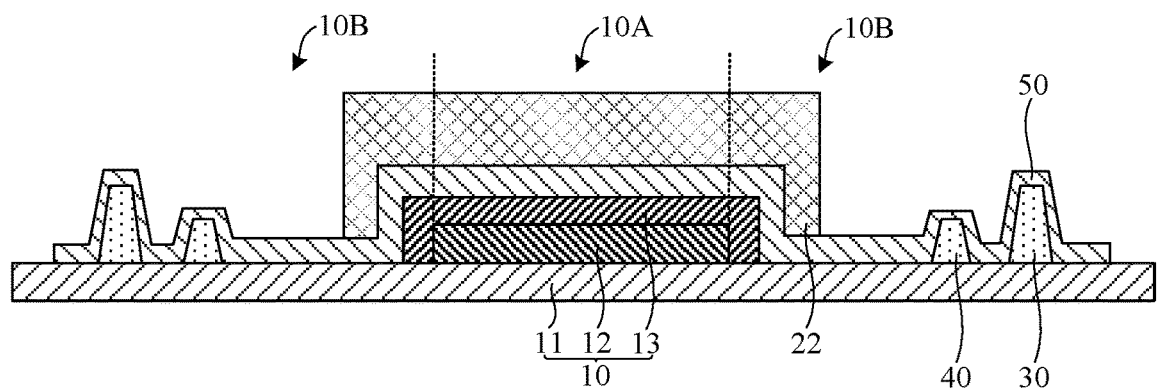
Figure 3:
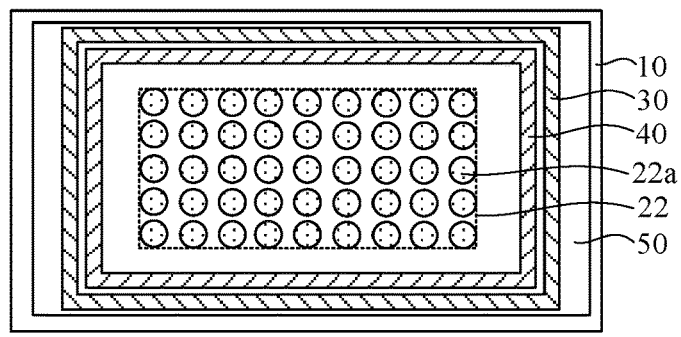
FIG. 3 is a plane schematic structural diagram corresponding to FIG. 2B.

B2: forming the second organic packaging section 22 to be cured on the first electrode 13, as shown in FIG. 2B and FIG. 3.

Specifically, using the epoxy resin as the packaging materials to prepare a first ink 22A without the water absorbent 211, and spraying the first ink 22A evenly on a surface of the first electrode 13 by the ink-jet printing process. Wherein, a boundary of the first ink 22A is located on one side of the first electrode 13 away from the display area 10A. In the present embodiment, it is necessary to ensure that a certain space is reserved between the first ink 22A and the second retaining wall 40 to accommodate the first organic packaging section 21 in next step.

Figure 2C:
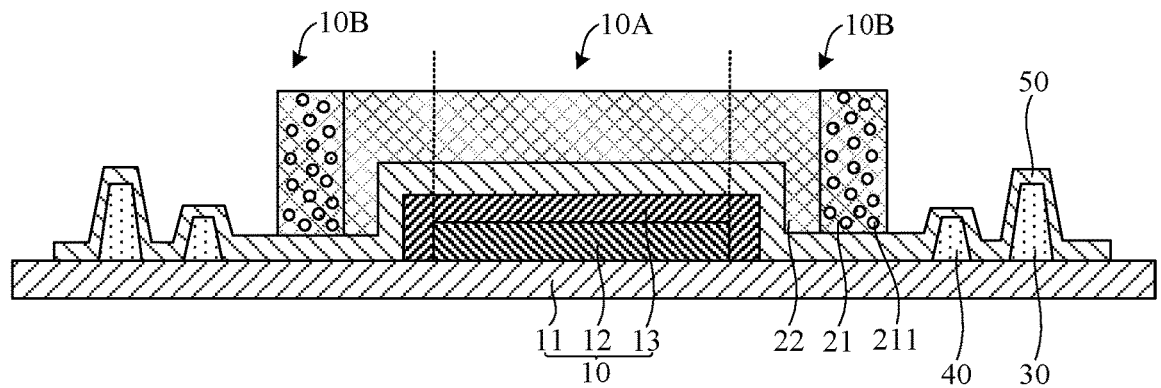
Figure 4:
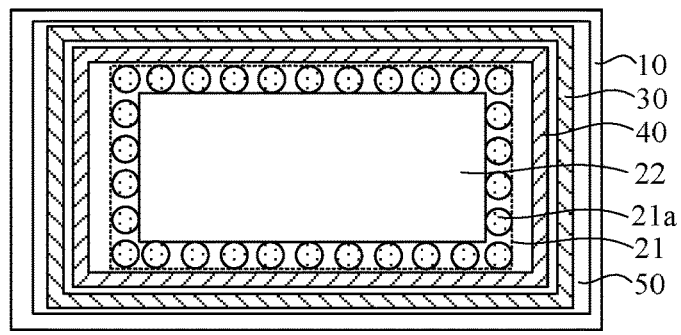
FIG. 4 is a plane schematic structural diagram corresponding to FIG. 2C.

B3: forming the first organic packaging section 21 to be cured on the first inorganic packaging layer 50, as shown in FIG. 2C and FIG. 4.

Specifically, using the epoxy resin as the packaging materials to prepare a second ink 21A containing the water absorbent 211, and spraying the second ink 21A evenly between the second organic packaging section 22 to be cured and the second retaining wall 40 by the ink-jet printing process. Wherein, a boundary of the second ink 21A is located on one side of the second retaining wall 40 close to the display area 10A.

It should be noted that in some embodiments, the epoxy resin mixed with the water absorbent 211 can also be directly coated on a surface of the second organic packaging section 22 to be cured by a coating process, which will not be described here.

Figure 2D:
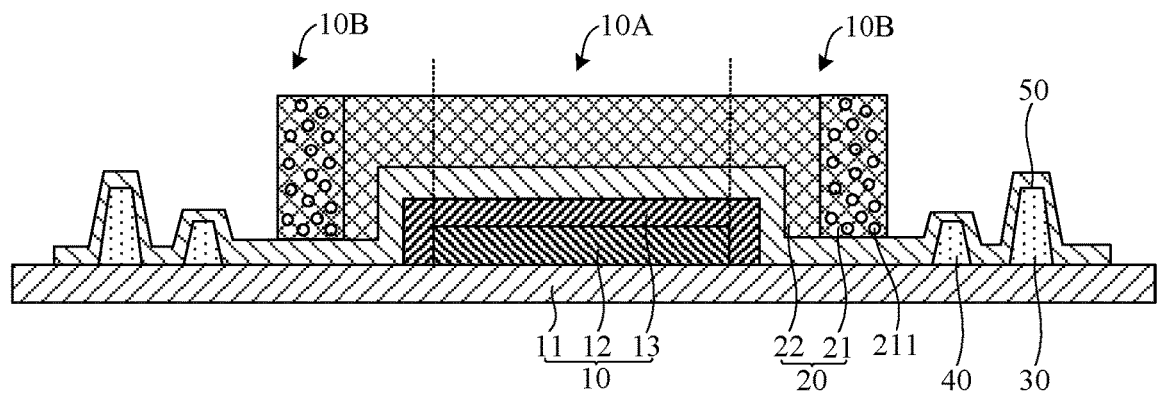
Figure 5:
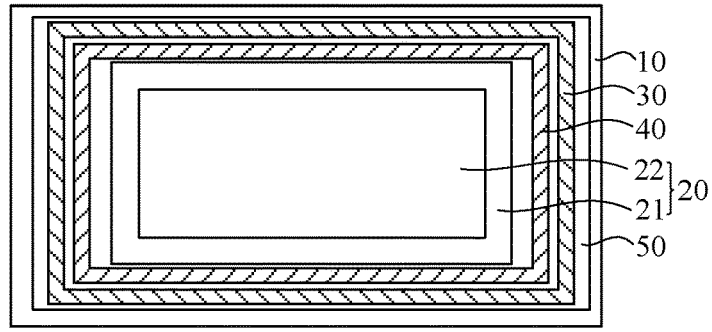
FIG. 5 is a plane schematic structural diagram corresponding to FIG. 2D.

B4: curing the first organic packaging section 21 and the second organic packaging section 22 to form the first organic packaging layer 20, as shown in FIG. 2D and FIG. 5.

After the first ink 22A and the second ink 21A is leveled, curing the first organic packaging section 21 to be cured and the second organic packaging section 22 to be cured under ultraviolet light, thereby forming the first organic packaging layer 20.

Figure 2E:
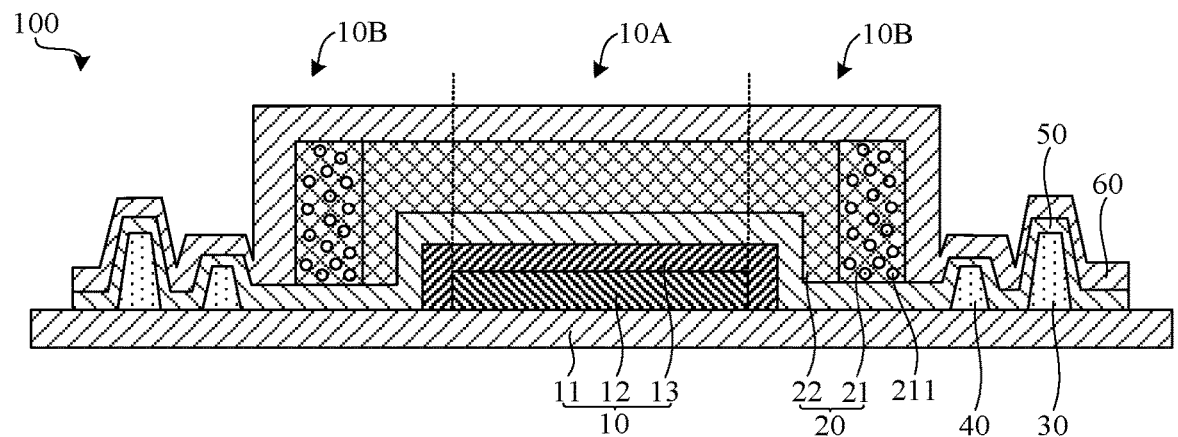

B5: forming the second inorganic packaging layer 60 on the first organic packaging layer 20, as shown in FIG. 2E.

Specifically, the second inorganic packaging layer 60 is formed by the PECVD process with materials of one or more of silicon oxide, silicon nitride, and silicon oxynitride.

Thus, the preparation method of the OLED display panel 100 provided by the present embodiment is completed.

Figure 6:
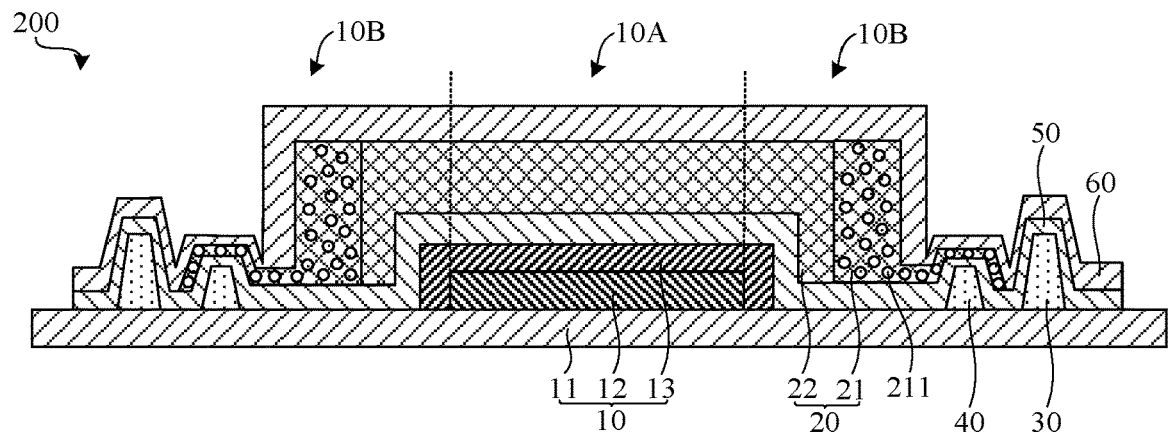
FIG. 6 is a schematic structural diagram of an OLED display panel provided in a second embodiment of the present application.

Referring to FIG. 6, a second embodiment of the present application provides the OLED display panel 200. The OLED display panel 200 provided in the second embodiment of the present application is different from the first embodiment in that the first organic packaging section 21 covers the second retaining wall 40 and extends to an area where the driving substrate 11 is located between the first retaining wall 30 and the second retaining wall 40.

Specifically, the first organic packaging section 21 covers an area where the first inorganic packaging layer 50 is not covered by the second organic packaging section 22, and one end of the first organic packaging section 21 away from the display area 10A is located between the first retaining wall 30 and the second retaining wall 40.

Compared with the OLED display panel 100 provided in the first embodiment, the OLED display panel 200 provided in the present embodiment reduces a distance from the first organic packaging section 21 to an edge of the main display part 10, and can further delay the time of the water vapor intrusion to the display area 10A in case of the external water vapor intrusion, so as to further reduce the failure probability of the light-emitting devices.

Figure 7:
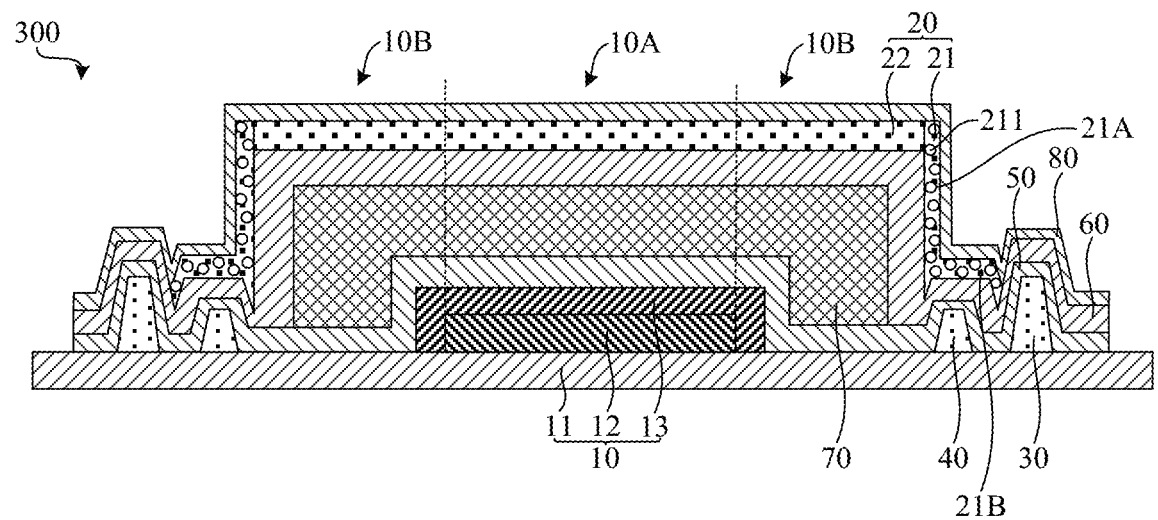
FIG. 7 is a schematic structural diagram of an OLED display panel provided in a third embodiment of the present application.

Referring to FIG. 7, a third embodiment of the present application provides the OLED display panel 300. The OLED display panel 300 provided in the third embodiment of the application is different from the second embodiment in that the OLED display panel 300 also comprises a second organic packaging layer 70 and a third inorganic packaging layer 80, wherein the second organic packaging layer 70 is located between the first inorganic packaging layer 50 and the second inorganic packaging layer 60, and a boundary of the second organic packaging layer 70 is located on one side of the second retaining wall 40 close to the display area 10A, the first inorganic packaging layer 20 is located on one side of the second inorganic packaging layer 60 away from the first inorganic packaging layer 50, the first organic packaging section 21 is located between the second organic packaging layer 70 and the first retaining wall 30, the third inorganic packaging layer 80 is located on one side of the first organic packaging layer 20 away from the second inorganic packaging layer 60, and the third inorganic packaging layer 80 covers the first organic packaging layer 20 and the first retaining wall 30. The first organic packaging section 21 includes a vertical portion 21A and a horizontal portion 21B connected to the vertical portion 21A; the vertical portion 21A is disposed at a side of the second retaining wall 40 away from the first retaining wall 30, and a side surface of the vertical portion 21A close to the display area 10A is in contact with a side surface of the second organic packaging section 22 and a side surface of the second inorganic packaging layer 50; and the horizontal portion 21B and the second inorganic packaging layer 50 both cover an upper surface of the second retaining wall 40, and the horizontal portion 21B is in contact with an upper surface of a part of the second inorganic packaging layer 50 located above the second retaining wall 40.

In the present embodiment, the first inorganic packaging layer 50, the second organic packaging layer 70, the second inorganic packaging layer 60, the first organic packaging layer 20 and the third inorganic packaging layer 80 constitute a packaging structure. Compared with a laminated structure of an inorganic packaging layer, an organic packaging layer, and an inorganic packaging layer, the present embodiment can further improve an overall packaging effect of the OLED display panel by adding an organic packaging layer and an inorganic packaging layer.

In addition, in the present embodiment, by setting two organic packaging layers, and only arranging the water absorbent 211 in the first organic packaging section 21 in the first organic packaging layer 20, while the second organic packaging layer 70 does not contain the water absorbent 211, and then at the edges of the non-display area 10B, if the water resistance of inorganic packaging layers such as the first inorganic packaging layer 50, the second inorganic packaging layer 60 or the third inorganic packaging layer 80 decreases or the inorganic packaging layers crack, when the external water vapor invades from the edges of the main display part 10, the invaded external water vapor will first enter the first organic packaging section 21 and be absorbed by the water absorbent 211 in the first organic packaging section 21, thereby delaying the time for the external water vapor to enter the display area 10A from the first organic packaging section 21, which can improve the packaging effect of the edges of the OLED display panel 300.

Figure 8:
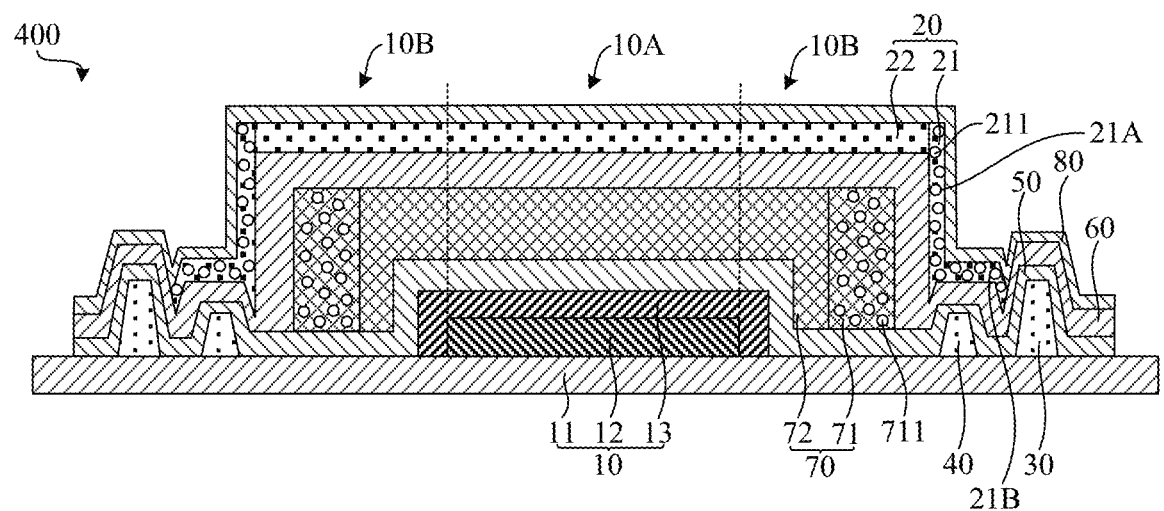
FIG. 8 is a schematic structural diagram of an OLED display panel provided in a fourth embodiment of the present application.

Referring to FIG. 8, a fourth embodiment of the present application provides the OLED display panel 400. The OLED display panel 400 provided in the fourth embodiment of the present application is different from the third embodiment in that the second organic packaging layer 70 comprises a third organic packaging section 71 and a fourth organic packaging section 72, wherein the fourth organic packaging section 72 is located in the display area 10A and extends to part areas of the non-display area 10B, and the third organic packaging section 71 is disposed around the fourth organic packaging section 72 and located in the non-display area 10B, wherein the third organic packaging section 71 comprises water absorbent 711. The first organic packaging section 21 includes a vertical portion 21A and a horizontal portion 21B connected to the vertical portion 21A; the vertical portion 21A is disposed at a side of the second retaining wall 40 away from the first retaining wall 30, and a side surface of the vertical portion 21A close to the display area 10A is in contact with a side surface of the second organic packaging section 22 and a side surface of the second inorganic packaging layer 50; and the horizontal portion 21B and the second inorganic packaging layer 50 both cover an upper surface of the second retaining wall 40, and the horizontal portion 21B is in contact with an upper surface of a part of the second inorganic packaging layer 50 located above the second retaining wall 40.

At the edges of the non-display area 10B, if the water resistance of the inorganic packaging layers such as the first inorganic packaging layer 50, the second inorganic packaging layer 60 or the third inorganic packaging layer 80 decreases or the inorganic packaging layers crack, when the external water vapor invades from the edges of the main display part 10, the invaded external water vapor will first enter the first organic packaging section 21 and be absorbed by the water absorbent 211 in the first organic packaging section 21, and then, if the external water vapor continues to invade the second organic packaging layer 70 along a direction close to the display area 10A, the external water vapor will first enter the third organic packaging section 71 and be absorbed by the water absorbent 711 in the third organic packaging section 71. Therefore, the present embodiment can greatly delay the time for the external water vapor to invade the display area 10A through a dual water absorption of the first organic packaging section 21 and the third organic packaging section 71, so as to significantly improve the packaging effect of the edges of the OLED display panel 400.

The present application also provides an electronic device, which can be any products or components with a display function, such as electronic papers, mobile phones, tablet computers, TVs, displays, notebook computers, digital photo frames, navigators, etc. Wherein, the electronic device comprises a shell and the OLED display panel arranged in the shell. The OLED display panel can be the OLED display panel described in any of the foregoing embodiments. Specific structure of the OLED display panel can refer to descriptions of the foregoing embodiments and will not be repeated here.

The above describes the OLED display panel and the electronic device provided by the embodiments of the present application in detail. In this paper, specific examples are applied to explain a principle and implementation modes of the present application. The descriptions of the above embodiments are only used to help understand a method and a core idea of the present application; meanwhile, for those skilled in the art, there will be changes in the specific implementation modes and an application scope according to the idea of the present application. In conclusion, contents of the specification should not be understood as restrictions on the present application.

What is claimed is:

1. An organic light-emitting diode (OLED) display panel comprising:
 a main display part having a display area and a non-display area disposed around the display area, and comprising a driving substrate and a first electrode arranged in sequence;
 a first inorganic packaging layer disposed on the first electrode and extending from the display area to the non-display area;
 a first organic packaging layer disposed on the first inorganic packaging layer, wherein the first organic packaging layer comprises a first organic packaging section and a second organic packaging section, the first organic packaging section is located in the non-display area, the first organic packaging section comprises water absorbent, and the second organic packaging section covers the first electrode and is connected with a surface of the first organic packaging section close to the display area;
 a second inorganic packaging layer disposed between the first inorganic packaging layer and the first organic packaging layer, and extending from the display area to the non-display area;
 a second organic packaging layer disposed between the first inorganic packaging layer and the second inorganic packaging layer, and extending from the display area to the non-display area;
 a third inorganic packaging layer disposed on the first organic packaging layer, and extending from the display area to the non-display area;
 a first retaining wall disposed on the driving substrate and located at a side of the first organic packaging section away from the display area; and
 a second retaining wall disposed on the driving substrate and located at a side of the first retaining wall close to the display area;
 wherein the first organic packaging section comprises a vertical portion and a horizontal portion connected to the vertical portion; the vertical portion is disposed at a side of the second retaining wall away from the first retaining wall, and a side surface of the vertical portion close to the display area is in contact with a side surface of the second organic packaging section and a side surface of the second inorganic packaging layer; and the horizontal portion and the second inorganic packaging layer both cover an upper surface of the second retaining wall, and the horizontal portion is in contact with an upper surface of a part of the second inorganic packaging layer located above the second retaining wall.

2. The OLED display panel according to claim 1, wherein the main display part further comprises a light-emitting layer disposed between the driving substrate and the first electrode, the light-emitting layer is located in the display area, the first electrode covers the light-emitting layer and extends from the display area to the non-display area, and the first organic packaging section is located on one side of the first electrode away from the display area.

3. The OLED display panel according to claim 1, wherein the first inorganic packaging layer and the second inorganic packaging layer cover the first retaining wall.

4. The OLED display panel according to claim 1, wherein a height of the second retaining wall is less than a height of the first retaining wall.

5. The OLED display panel according to claim 1, wherein a height of the second retaining wall is less than a height of the first retaining wall; and the first organic packaging section covers the second retaining wall and extends to an area where the driving substrate is located between the first retaining wall and the second retaining wall.

6. The OLED display panel according to claim 1, wherein an end of the first organic packaging section is flush with an end of the second organic packaging section.

7. The OLED display panel according to claim 1, wherein packaging materials in the first organic packaging section are the same as packaging materials in the second organic packaging section.

8. The OLED display panel according to claim 1, wherein, from the display area to a direction towards the non-display area, a mass content of the water absorbent in the first organic packaging section gradually increases.

9. The OLED display panel according to claim 1, wherein the second organic packaging layer comprises a third organic packaging section, the third organic packaging section is located in the non-display area, and the third organic packaging section comprises water absorbent.

10. The OLED display panel according to claim 1, wherein the second organic packaging layer comprises a third organic packaging section and a fourth organic packaging section, the fourth organic packaging section is located in the display area and extends to part areas of the non-display area, and the third organic packaging section is disposed around the fourth organic packaging section and located in the non-display area, wherein the third organic packaging section comprises water absorbent.

11. The OLED display panel according to claim 1, wherein the first inorganic packaging layer, the second inorganic packaging layer, and the third inorganic packaging layer all cover an upper surface of the first retaining wall and the upper surface of the second retaining wall; and wherein an end part of the first inorganic packaging layer, an end part of the second inorganic packaging layer, and an end part of the third inorganic packaging layer are all disposed at a side of the first retaining wall away from the second retaining wall.

12. An electronic device, wherein the electronic device comprises a housing and an organic light-emitting diode (OLED) display panel arranged in the housing, and the OLED display panel comprises:

a main display part having a display area and a non-display area disposed around the display area, and comprising a driving substrate and a first electrode arranged in sequence;

a first inorganic packaging layer disposed on the first electrode and extending from the display area to the non-display area;

a first organic packaging layer disposed on the first inorganic packaging layer, wherein the first organic packaging layer comprises a first organic packaging section and a second organic packaging section, the first organic packaging section is located in the non-display area, the first organic packaging section comprises water absorbent, and the second organic packaging section covers the first electrode and is connected with a surface of the first organic packaging section close to the display area;

a second inorganic packaging layer disposed between the first inorganic packaging layer and the first organic packaging layer, and extending from the display area to the non-display area;

a second organic packaging layer disposed between the first inorganic packaging layer and the second inorganic packaging layer, and extending from the display area to the non-display area;

a third inorganic packaging layer disposed on the first organic packaging layer, and extending from the display area to the non-display area;

a first retaining wall disposed on the driving substrate and located at a side of the first organic packaging section away from the display area; and a second retaining wall disposed on the driving substrate and located at a side of the first retaining wall close to the display area;

wherein the first organic packaging section comprises a vertical portion and a horizontal portion connected to the vertical portion; the vertical portion is disposed at a side of the second retaining wall away from the first retaining wall, and a side surface of the vertical portion close to the display area is in contact with a side surface of the second organic packaging section and a side surface of the second inorganic packaging layer; and the horizontal portion and the second inorganic packaging layer both cover an upper surface of the second retaining wall, and the horizontal portion is in contact with an upper surface of a part of the second inorganic packaging layer located above the second retaining wall.

13. The electronic device according to claim 12, wherein the main display part further comprises a light-emitting layer disposed between the driving substrate and the first electrode, the light-emitting layer is located in the display area, the first electrode covers the light-emitting layer and extends from the display area to the non-display area, and the first organic packaging section is located on one side of the first electrode away from the display area.

14. The electronic device according to claim 13, wherein the second organic packaging layer comprises a third organic packaging section and a fourth organic packaging section, the fourth organic packaging section is located in the display area and extends to part areas of the non-display area, and the third organic packaging section is disposed around the fourth organic packaging section and located in the non-display area, wherein the third organic packaging section comprises water absorbent.

15. The electronic device according to claim 13, wherein the first inorganic packaging layer, the second inorganic packaging layer, and the third inorganic packaging layer all cover an upper surface of the first retaining wall and the upper surface of the second retaining wall; and wherein an end part of the first inorganic packaging layer, an end part of the second inorganic packaging layer, and an end part of the third inorganic packaging layer are all disposed at a side of the first retaining wall away from the second retaining wall.

16. The electronic device according to claim 12, wherein the first inorganic packaging layer and the second inorganic packaging layer cover the first retaining wall.

17. The electronic device according to claim 12, wherein a height of the second retaining wall is less than a height of the first retaining wall.

18. The electronic device according to claim 12, wherein a height of the second retaining wall is less than a height of the first retaining wall; and the first organic packaging section covers the second retaining wall and extends to an area where the driving substrate is located between the first retaining wall and the second retaining wall.

19. The electronic device according to claim 12, wherein an end of the first organic packaging section is flush with an end of the second organic packaging section.

20. The electronic device according to claim 12, wherein packaging materials in the first organic packaging section are the same as packaging materials in the second organic packaging section.

* * * * *